United States Patent
Buchwalter et al.

(10) Patent No.: US 6,617,698 B2
(45) Date of Patent: Sep. 9, 2003

(54) REWORKABLE AND THERMALLY CONDUCTIVE ADHESIVE AND USE THEREOF

(75) Inventors: Stephen Buchwalter, Hopewell Junction, NY (US); Michael Anthony Gaynes, Vestal, NY (US); Nancy C. LaBianca, Yalesville, CT (US); Stefano Sergio Oggioni, Milan (IT); Son K. Tran, Endicott, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/801,655

(22) Filed: Mar. 9, 2001

(65) Prior Publication Data

US 2002/0171132 A1 Nov. 21, 2002

(51) Int. Cl.[7] ............................................. H01L 23/48
(52) U.S. Cl. .................. 257/783; 257/706; 257/676; 257/780; 257/778; 257/784; 257/782; 257/789; 257/795

(58) Field of Search ................................. 257/783, 784, 257/782, 778, 789, 795, 780, 676, 706

(56) References Cited

U.S. PATENT DOCUMENTS

| 5,468,995 A | * | 11/1995 | Higgins ....................... 257/697 |
| 5,471,027 A | * | 11/1995 | Call et al. ................. 219/85.13 |
| 5,844,309 A | * | 12/1998 | Takigawa et al. ........... 257/701 |
| 6,214,460 B1 | * | 4/2001 | Bluem .................. 428/355 AC |

* cited by examiner

Primary Examiner—David L. Talbott
Assistant Examiner—Luan Thai
(74) Attorney, Agent, or Firm—Connolly Bove Lodge & Hutz, LLP; Daniel P. Morris

(57) ABSTRACT

Reworkable thermally conductive adhesive composition comprising a cured reaction product from a diepoxide wherein the epoxy groups are connected through an acyclic acetal moiety, a cyclic anhydride and a thermally conductive filler are provided and used to bond semiconductive devices to a chip carrier or heat spreader.

8 Claims, 5 Drawing Sheets

(3 of 5 Drawing Sheet(s) Filed in Color)

REWORKABLE AND THERMALLY CONDUCTIVE ADHESIVE AND USE THEREOF

DESCRIPTION

1. Technical Field

The present invention relates to microelectronic packaging structures and particularly to packaging structures that include bonding the semiconductor device to a chip carrier or heat spreader employing a reworkable and thermally conductive adhesive. In addition, the present invention relates to novel reworkable and thermally conductive adhesives.

2. Background of the Invention

A very common method of interconnecting a semiconductor die to other devices uses an adhesive, referred to as a die attach adhesive, to bond the passive or back side of the die to a substrate containing interconnect wiring (referred to as a chip carrier). The die is also electrically connected to the chip carrier with wirebonds from peripheral 1/O pads on the die to corresponding pads on the carrier. The die attach adhesive must be cured prior to the wirebonding operation to make certain that the chip does not move during wirebonding. With the usual die attach adhesives, rework of a misaligned or defective chip, or one on which a wirebonding defect has been found by inspection, is then impossible because the adhesive is an insoluble thermoset plastic. This is a significant limitation because partially good assemblies cannot be reworked to recover the value of the good components of the assembly.

Although thermoplastic die attach adhesives have been used for reworkability, their adhesive characteristics are inferior to the more preferred thermoset materials used for this purpose. Moreover, the thermoplastic materials exhibit certain process disadvantages over a thermoset. In one case, the thermoplastic is a paste, which is dissolved in a solvent. If the die is placed before solvent evaporation, there will be a lot of voids in the bond line after bonding. If the solvent is evaporated before die placement, then there is a firm thermoplastic bump/solid that will require chip placement under heat, pressure for some time to accomplish bonding.

It is difficult to achieve thin bond lines, typical of die attach processing (<0.002") with a dried thermoplastic bump. The thermoplastic resists flow because of its inherently much larger molecular weight (compared to an unreacted thermoset monomer) and in combination with very high filler loadings become even more difficult to spread.

An alternative thermoplastic approach is to provide precast films of thermoplastic. No solvent dry process is needed and the films are already in a thin bond line thickness (e.g. 0.001, 0.002, 0.003"). However, these still have a big process downside. Bonding flat-to-flat surfaces with films will always result in air entrapment (at least 30% at one interface and more typically >50% at both interfaces). Air entrapment can be eliminated with a vacuum lamination or vacuum bagging with autoclave—two non standard, and expensive batch processes. Film bonding also requires temperature, pressure and process time.

Accordingly, there exists a need for providing improved adhesives for such purposes.

SUMMARY OF INVENTION

The present invention provides an adhesive that is reworkable along with making it possible to fabricate packaging structures providing functionality and reliability equivalent to conventional wirebonded or flipchip packaging. For multichip (MCM) package configurations, reworkability is of particular value because it avoids the loss of valuable chips in partially good MCMs.

In particular, the present invention relates to a packaging structure comprising at least one semiconductor device bonded to a chip carrier or heat spreader with an adhesive wherein the adhesive is reworkable and thermally conductive and comprises a cured reaction product from a diepoxide wherein the epoxy groups are connected through an acyclic acetal moiety; and a thermally conductive filler.

Another aspect of the present invention relates to a method for fabricating packaging structure which comprises bonding at least one semiconductor device to a chip carrier or heat spreader by applying a thermally conductive adhesive composition comprising a diepoxide wherein the epoxy groups are connected through an acyclic acetal moiety; and; curing the composition to provide a reworkable and thermally conductive adhesive.

A still further aspect of the present invention is conceived with reworkable, thermally conductive adhesive composition comprising A) about 28 to about 60% with a cured reaction product from a diepoxide wherein the epoxy groups are connected through an acyclic acetal moiety, B) about 38 to about 70% by weight of a thermally conductive filler; and C) about 0.09 to about 2% by weight of a thixotropic agent based upon the total A, B, and C in the composition.

The present invention provides advantages of thermosets and the rework advantages of thermoplastics. The present invention makes possible structures wherein the bond line is void- free or free from air entrapment.

Still other objects and advantages of the present invention will become readily apparent by those skilled in the art from the following detailed description, wherein it is shown and described preferred embodiments of the invention, simply by way of illustration of the best mode contemplated of carrying out the invention. As will be realized the invention is capable of other and different embodiments, and its several details are capable of modifications in various obvious respects, without departing from the invention. Accordingly, the description is to be regarded as illustrative in nature and not as restrictive.

BRIEF DESCRIPTION OF THE DRAWINGS

The patent or application file contains at least one drawing executed in color. Copies of this patent or patent application publication with color drawing(s) will be provided by the office upon request and payment of the necessary fee.

BEST AND VARIOUS MODES FOR CARRYING THE INVENTION

Figure 1:
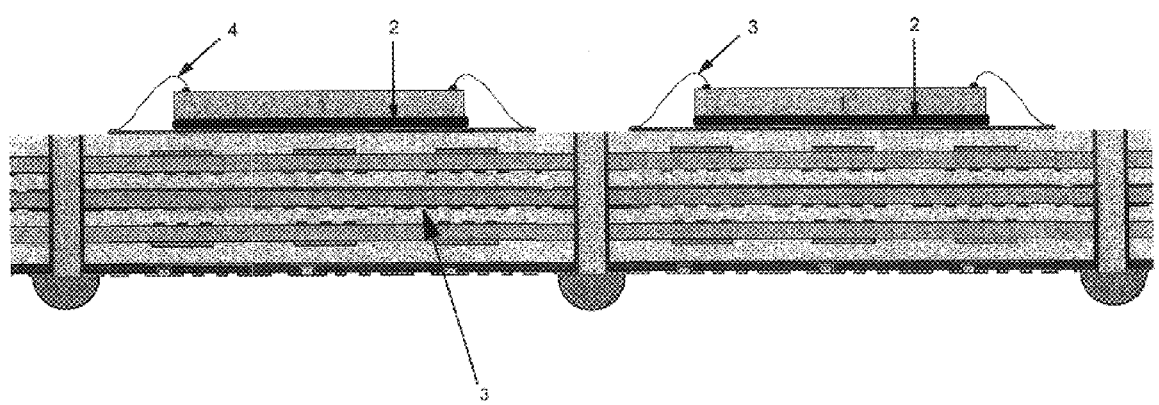
FIG. 1 shows a schematic cross-section of the packaging structure of this invention.

In order to facilitate an understanding of the present invention reference will be made to the figures. In particular, FIG. 1 illustrates a packaging structure according to the present invention wherein 1 represents a semiconductor device or plurality of semiconductor devices such as a silicon semiconductor; 2 represents the reworkable die attach adhesive; 3 represents the wirebond interconnector and 4 the chip carrier.

The semiconductor device(s) are typically selected from one or more of the families of silicon technology including microprocessors, memory chips, analog devices, and/or devices for wireless communications. In addition, passive components such as resistors and capacitors may need to be attached to the chip carrier at sites adjacent to the semiconductor devices.

The reworkable adhesive composition comprises a cured reaction product from a diepoxide and a cyclic anhydride wherein the epoxy groups are connected through an acyclic acetal moiety and thermally conductive filler.

The diepoxide compounds employed according to the present invention are cleavable and contain two epoxide groups that are connected together through an acyclic acetal linkage. Examples of suitable diepoxide compounds are disclosed in U.S. Pat. Nos. 5,512,613; 5,560,934; 5,932,682, 5,858,943, and 5,879,859 disclosures of which are incorporated herein by reference. Also see "Cleavable Epoxy Resist: Design for Disassembly of a Thermoset," Buchwalter, et al., *Polym, Sci.: A: Polym. Chem.* 34,249–60 (1996). The term "acetal" refers to the 1,1-dialkoxy groups as described in the formulae below where R and R' can be alkyl, aryl, aralkyl or hydrogen. The general use of the term "acetal" includes ketals (with R and R'=alkyl, aryl or aralkyl), acetals (with R-alkyl, aryl or aralkyl and R'=H and formals (R and R'=H). As disclosed in *Advanced Organic Chemistry*, J. March, 3$^{rd}$ Edition, Wiley Interscience (1985), pp.329–331, the known organic chemistry of acetals indicates that they are stable to hydrolysis in the absence of acids, but break down readily in acid, even weak acids.

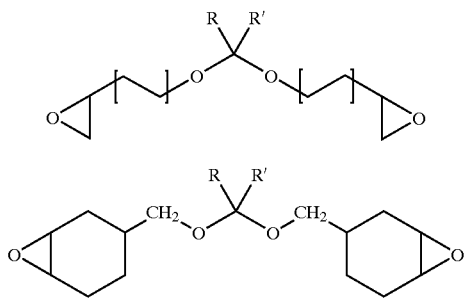

Examples of some specific cycloaliphatic diepoxides suitable for us in the present invention are acetaldehyde bis-(3, 4-epoxycyclohexylmethyl) acetal, acetone bis-(3,4-epoxycyclohexylmethyl) ketal, and formaldehyde bis-(3,4-epoxycyclohexylmethyl) acetal.

The preferred diepoxide compound is acetaldehyde bis-(3,4-epoxycyclohexylmethyl) acetal, also referred to hereinafter as acetal diepoxide.

The composition can also include a curing agent and curing promoter or catalyst, if desired. Typical curing agents are cyclic dicarboxylic anhydrides. The cyclic dicarboxylic anhydride can be any of the well-known anhydride curing agents(see, for example, Lee and Neville, *Handbook of Epoxy Resins*, McGraw-Hill, 1967, Chapter 12) including hexahydrophthalic anhydride, methylhexahydrophthalic anhydride, nadic methyl anhydride, maleic anydride, and the like.

Typically, the concentration of the cyclic anydride is such that the anhydride/diepoxide ratio of equivalents is less than or equal to 0.90.

Typical catalysts include tertiary amines and a 1.3-diaza compound having two nitrogen atoms present with one nitrogen atom doubly bonded to the central carbon and singly bonded to one other carbon, and the other nitrogen atom singly bonded to the central carbon and singly bonded to another carbon and singly bonded to a hydrogen. Each of the diaza compounds and amines can be used solely or in combination.

Examples of suitable 1,3 diaza compounds include imidazole; 2-ethyl-4-methylimidazole; 2-methylimidazole; 5-methylimidazole; propoxylated imidazole; 4-methylimidazole; 2-ethylimidazole; and 1,8-diazabicyclo [5.4.0]undec-7-ene(DBU). The amine promoter can be any tertiary amine or aromatic amine such as benzyldimethylamine, triethylamine, pyridine, 1,4-diazabicyclo[2.2.2] octane, and the like.

Examples of suitable thermally conductive fillers are silver flake, aluminum nitride and silica-coated aluminum nitride. Preferably this filler is a non-electrically conductive material such as aluminum nitride and silica-coated aluminum nitride.

According to preferred embodiments, a thixotropic agent is also included in the composition. Suitable thixotropic agents are fumed silica and siloxane-coated fumed silica.

The amount of diepoxide is typically about 10 to about 30% by weight and preferably about 15 to about 20% by weight.

The amount of cyclic anhydride is typically about 10 to about 30% by weight and preferably about 15 to about 20% by weight.

The amount of thermally conductive filler is typically about 40 to 79% by weight and preferably about 54 to about 79% by weight.

The amount of thixotropic agent is typically about 0.05 to about 2% by weight and preferably about 0.1 to about 1% by weight.

The above amounts of diepoxide, cyclic anhydride, filler and thixotropic agent are based upon the total amount of diepoxide, cyclic anhydride, filler and thixotropic agent in the composition.

In addition, when desired the compositions can include other ingredients such as a toughener or flexibilizer to improve mechanical properties and a solvent to modify the viscosity for spinning films. The flexibilizer can be any number of oligomeric or polymeric materials that are compatible with the epoxy material. Examples include phenoxy resins and polyether and polyester diols such as poly (propylene glycol), poly (ethylene glycol), poly (caprolactone) diol and poly (oxyethylene) diol. Also butadiene-acrylonitrile copolymers such as HYCAR® from B. F. Goodrich and maleic anhydride adducts of polybutadiene resins, e.g. —RT— 130 from Ricon Resins and functionalized polybutadienes such as Poly BD 600 from Atochem can be used as the flexibilizer.

In addition, the compositions, when desired, can include an organic non-reactive diluent to facilitate the coating operation. However, the use of a solvent is not especially preferred since voids can form when the solvent is driven off. Examples of suitable solvents include ketones such as acetane, methyl ethyl ketone, methyl isobutyl ketone and methyl amyl ketone, and methylene chloride. When employed, the diluent is present in an amount sufficient to provide compositions for coating application. The following represents a preferred composition of the present invention:

TABLE 1

| Component | Parts by weight |
| --- | --- |
| Acetal diepoxide | 50 |
| PBD-600[1] | 2.5 |
| Hexahydrophthalic anhydride | 35 |
| SCAN 71[2] | 262.4 |
| Degussa R202[3] | 2.12 |
| Ethylene glycol | 0.53 |
| 1,5-Diaza [5.1.0] bicycloundec-2-ene (DBU) | 0.6 |

[1]Polybutadiene resin supplied by Elf Atochem.
[2]Silica-coated aluminum nitride supplied by Dow Chemical.
[3]Siloxane-coated fumed silica from Degussa.

The composition can be prepared by mixing the acetal diepoxide, PBD-600 and hexahydrophthalic anhydride followed by adding the Scan 71 in three portions with mixing in a 3-speed mixer for about 5 minutes at lower speed. The Degussa 202 can then be added with mixing on a 3-speed mixer for about 5 minutes at lower speed. The ethylene glycol and DBU can be mixed together and added to the composition with mixing while degassing.

The composition can then be dispensed on the chip carrier 4 and the semiconductor device 1 placed on the adhesive 2, and the adhesive is then cured. For example, the epoxy formulations can be cured by heating at 90–200° C. for one to six hours, more typically about 100–150° C. for about two hours to form a hard tack-free solid. The preferred curing schedule includes a gel cure for about one hour at 80–100° C., followed by a post-cure of about two hours at 135–165° C.

The adhesive desirably forms a void-free film between the semiconductor and the chip carrier. The thickness must meet the heat dissipation requirements of the application and avoid excessive spreading of the adhesive from the chip site to adjacent wirebond pads.

Typical thicknesses of the adhesive are about 30 microns to about 100 microns and more typically about 50 microns to about 70 microns.

The semiconductor device 1 includes electrically conductive sites (not shown) that are typically aluminum, gold and solder connected to a conductive site by an electrically conductive wire 3. The wirebonds (3) can be any of the wirebond technologies known in the art including gold, or aluminum wires of any thickness suitable for making reliable interconnections. Either ball or wedge bonding can be used.

The wires are typically about 0.0005 to about 0.003 and more typically about 0.001 to about 0.003 inches thick.

The other end of this wire is connected to a conductive site or lead (not shown) on the chip carrier (4).

The chip carrier (4) serves to interconnect the semiconductor device(s) 1 with other devices either on the same carrier or to devices on other chip carriers via intermediate circuitry. The chip carrier can be a printed circuit card with or without microvia build-up circuits, a ceramic substrate with or without deposited thin film circuits, or a flexible circuit substrate.

The chip carrier can support a single chip or multiple chips as a multichip module (MCM). If MCM, the carrier can include wirebonded chips, flip chips (area array interconnection), or chips prepackaged in the wide variety of plastic packages available in the industry including chip scale packages, etc. The chip carrier can be connected to the next level of packaging, e.g. a printed circuit board, by any of the technologies available in the industry including ball grid array (BGA) as shown in FIG. 1, soldering by surface mount technology, pin grid array (PGA), or land grid array (LGA).

Figure 2:
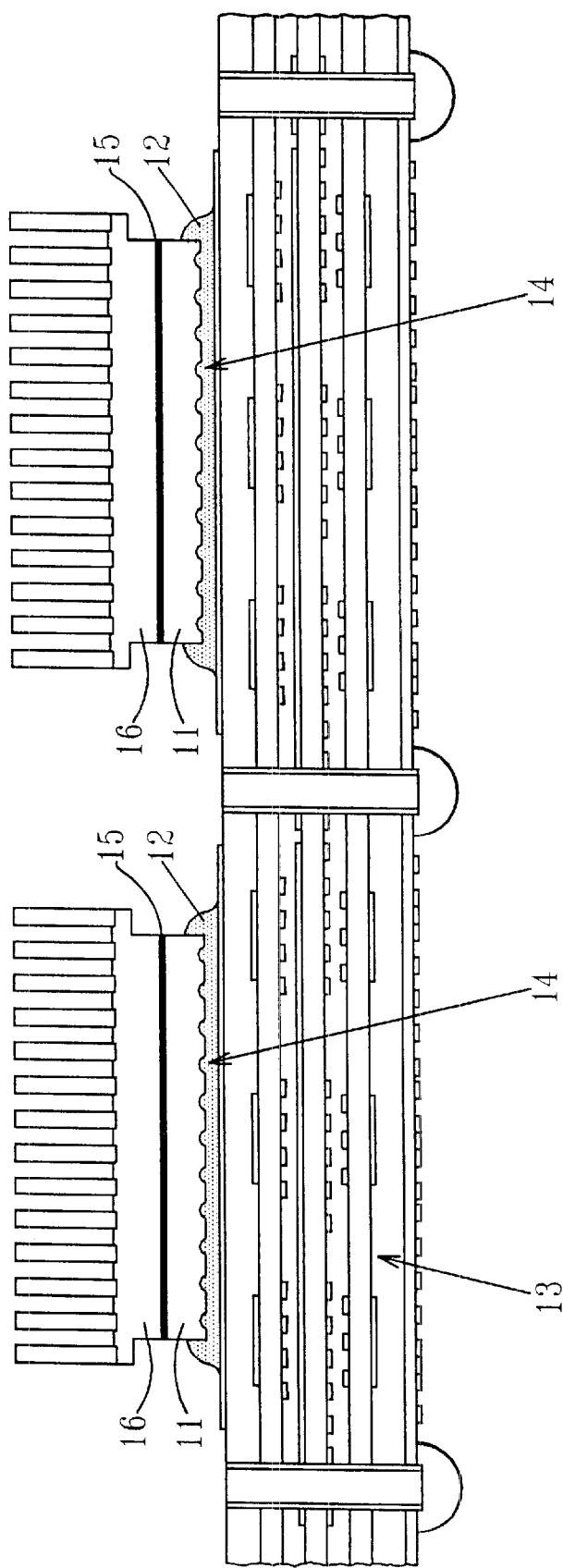
FIG. 2 shows a schematic cross-section of another packaging structure of this invention.

Another packaging structure of the present invention incorporates the elements shown in FIG. 2: a silicon semiconductor device or devices (11) attached by the interconnect technology known in the art as flip chip; an optionally an underfill encapsulant that can be reworkable (12); a chip carrier (13); flip chip solder interconnects (14); a reworkable heat sink adhesive (15); and a heat sink (16). The semiconductor device(s) (11), as discussed above, can be selected from one or more of the families of silicon technology including microprocessors, memory chips, analog devices, and/or devices for wireless communications. In addition, passive components such as resistors and capacitors may need to be attached to the chip carrier at sites adjacent to the semiconductor devices.

The underfill encapsulant can be any of the well established, commercially available non-reworkable materials, or optionally a reworkable underfill including the cleavable epoxy resin compositions disclosed in U.S. Pat. Nos. 5,512,613; 5,560,934; 5,932,682, 5,858,943, and 5,879,859 disclosures of which are incorporated herein by reference. Also see "Cleavable Epoxy Resis: Design for Disassembly of a Thermoset," Buchwalter, et al., *Polym, Sci.: A: Polym. Chem.* 34, 249–60 (1996).

The reworkable heat sink adhesive (15) is a composition according to the present invention as disclosed above including the cleavable epoxy resin composition and thermally conductive filler such as silver flake, aluminum nitride, or silica-coated aluminum nitride, and optionally the thixotropic agent such as fumed silica or siloxane-coated fumed silica. The most preferred embodiment includes an adhesive with the composition shown in Table 1 above.

Figure 3:
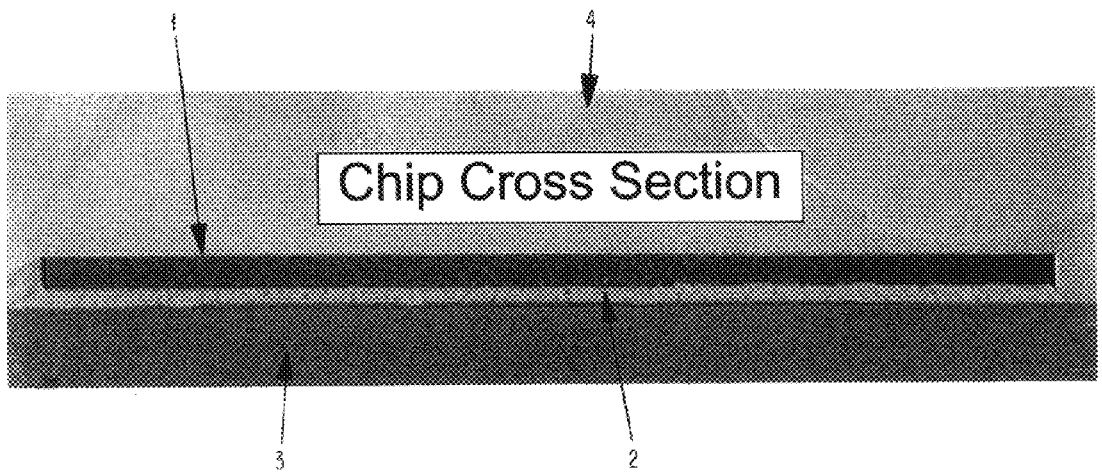
FIG. 3 is a photomicrograph of a semiconductor chip bonded with the die attach adhesive of this invention.

FIG. 3 is a photomicrograph showing a cross-section in epoxy potting compound (5) of the preferred reworkable die attach adhesive (2) illustrating its ability to form a void-free, thin bond-line between the chip (1) and the chip carrier (3) with limited spreading beyond the chip site. Typical suitable, potting compositions are disclosed in U.S. Pat. Nos. 4,235,620, 4,592,944, and 4,818,812.

Figure 4:
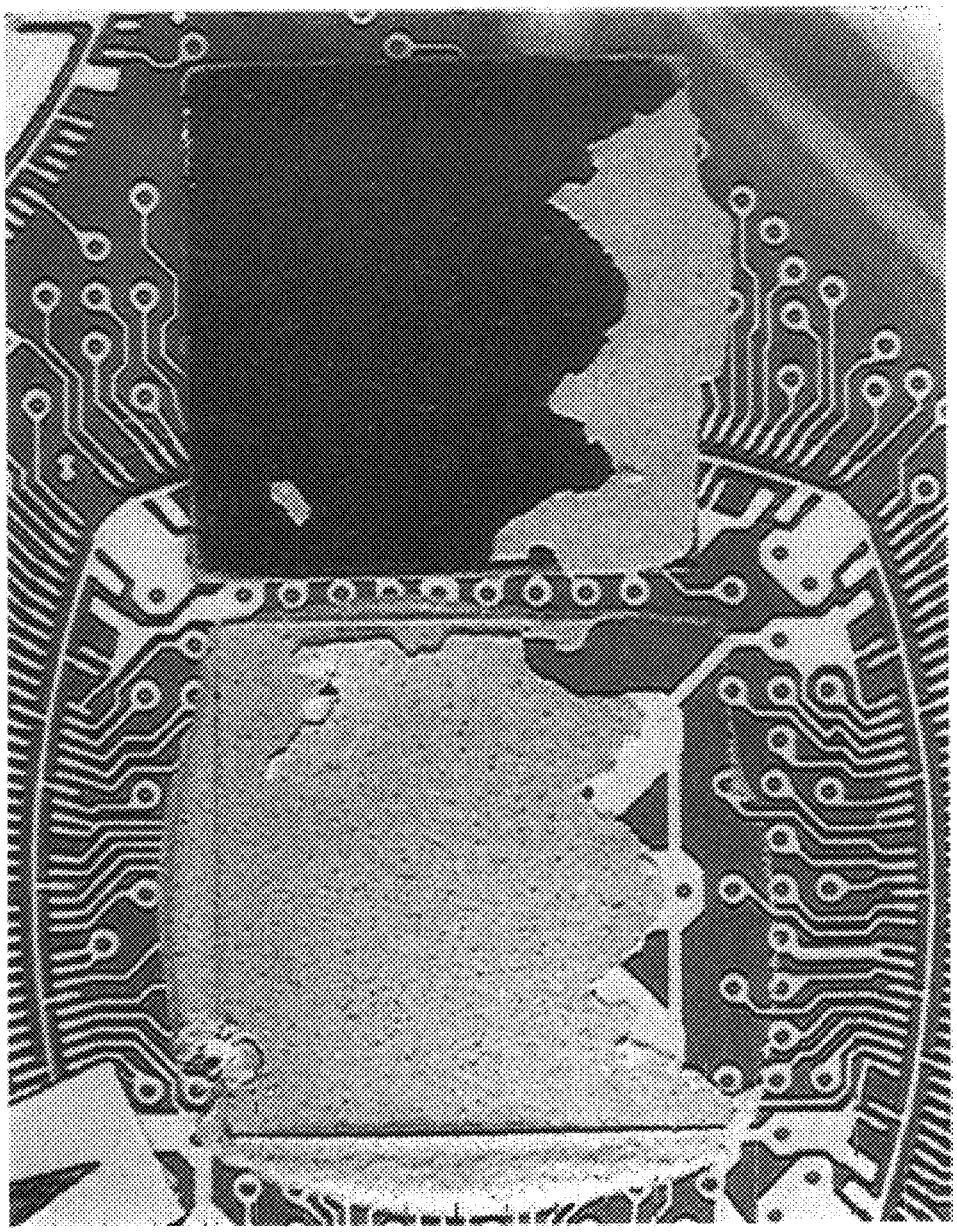
FIG. 4 is photomicrograph of a chip site after removal of a chip.
Figure 5:
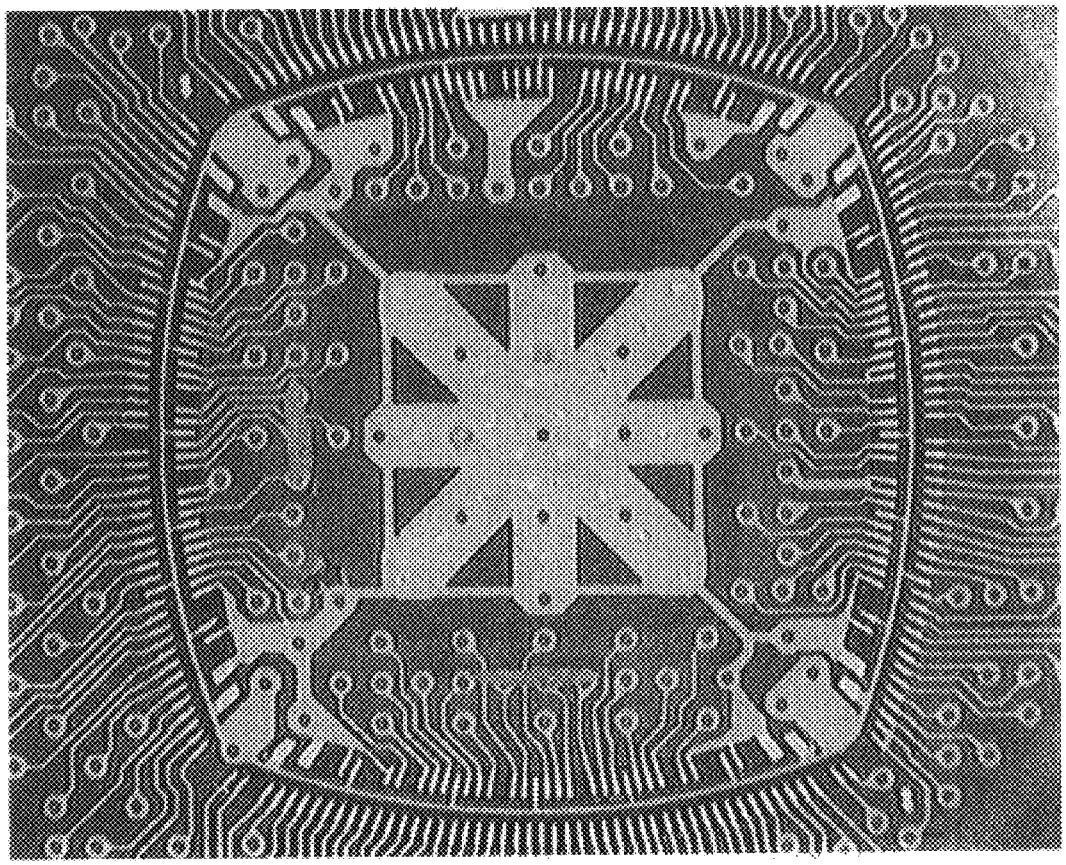
FIG. 5 is a photomicrograph of the same chip site of FIG. 4 after removing the die attach adhesive with the removal gel.

Reworkability is illustrated in FIGS. 4 and 5. If a defective, misaligned or unsuccessfully wirebonded chip needs to be removed, the first step is to remove the wirebonds (3) from the chip and chip carrier by pulling the bonds (5) from the pads (not shown). The chip site is then heated by applying a heated probe with gripping capability to the top of the chip (1) and applying a twisting and pulling force to the chip (1). The preferred temperature for the probe is about 250–290° C. FIG. 4 shows a chip (1) and chip site after chip removal with the die attach adhesive (2) remaining on both surfaces. FIG. 5 shows the same chip site after application of the removal gel, as disclosed in U.S. Pat. No. 5,858,943, disclosure of which is incorporated herein by reference.

The gel composition contains three essential components: 1) an acid to break the crosslinks in the reworkable adhesive; 2) a solvent to dissolve the uncrosslinked material and disperse the inorganic filler particles; and 3) a thickener to gel the mixture. These three components are simply blended together. Proportions are 1–20 parts by weight acid, 100 parts solvent, and 2–400 parts thickener. The acid can be any of a number of acids such as p-toluenseulfonic acid or methanesulfonic acid. The preferred acid is methanesulfonic acid. The solvent can also be any of a number of primary alcohols or blends of primary alcohols with other solvents such as ethanol, xylene/1-butanol/ethylene glycol, or 2,2,2-trifluroethanol. The preferred solvent is 2,2,2-trifluorethanol. The thickener can be any starch or cellulose derivative, which dissolves in the solvent/acid mixture and gels the mixture. The preferred cellulose thickener is a carboxymethyl celluose sold by FMC Corporation as Aquateric CD910. The thickener can also be one of the known thixotripic agents such as treated fumed silicas. The preferred fumed silica is Cab-O-Sil TS720 from the Cabot Corporation.

TABLE 2

Table 2 gives examples of the wire bond strengths of wire bonds made to reworked chip sites. The values given are equivalent to those obtained on a non-reworked site.

TABLE 2

| Wire bond pull strengths for reworked chip sites. | | |
|---|---|---|
| | Average | Average - 3σ |
| Sample 1 | 10.24 | 6.97 |
| Sample 2 | 14.68 | 9.32 |
| Sample 3 | 12.12 | 6.68 |
| Sample 4 | 10.6 | 6.16 |

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A workable thermally conductive adhesive composition comprising a) about 20 to out 60% by weight of a cured reaction product from diepoxide and a cyclic anhydride wherein the epoxy groups are connected through an acyclic acetal moiety b) about 40 to about 79% by weight of a thermally conductive filler; c) about 0.05 to about 2% by weight of a thixotropic agent based upon the total a), b), and c) in the composition.

2. The composition of claim 1 wherein the diepoxide is a cycloaliphatic diepoxide.

3. The composition of claim 1 wherein the diepoxide is selected from the group consisting of acetaldehyde bis-3,4-epoxycyclophexyl) acetal, acetone bis-3,4-epoxycyclohexylmethyl) ketal, and formaldehyde bis-3,4-epoxycyclohexylmethyl) acetal.

4. The composition of claim 1 wherein the diepoxide is acetaldehyde bis-3,4-epoxycyclohexylmethyl) acetal.

5. The composition of claim 1 wherein the filler is non-electrically conductive.

6. The composition of claim 1 wherein the filler is selected from the group consisting of silver flake, aluminum nitride and silica-coated aluminum nitride.

7. The composition of claim 1 wherein the filler is aluminum nitride or silicia-coated aluminum nitride.

8. The composition of claim 1 wherein the thixotropic agent comprises silica or siloxane-coated firmed silica.

* * * * *

UNITED STATES PATENT AND TRADEMARK OFFICE
CERTIFICATE OF CORRECTION

PATENT NO. : 6,617,698 B2
DATED : September 9, 2003
INVENTOR(S) : Stephen L. Buchwalter et al.

It is certified that error appears in the above-identified patent and that said Letters Patent is hereby corrected as shown below:

<u>Title page,</u>
Item [56], References Cited, U.S. PATENT DOCUMENTS, please add:
-- 5,932,662    8/199         Buchwalter et al. ........................ 528/94
   5,824,568   10/1998        Zechman ................................ 438/112
   5,879,859    3/1989        Buchwalter et al. ........................ 430/280.1
   5,512,613    4/1996        Afzali-Ardakani et al. ................... 523/443
   5,656,943    1/1999        Buchwalter et al. ........................ 510/204
   5,923,090    7/1999        Fallon et al. ............................ 257/777
   5,560,934   10/1996        Afzali-Ardakani et al. ................... 424/497 --
OTHER PUBLICATIONS, should read:
-- Buchwalter et al., "Cleavable Epoxy Resins: Design for Disassembly of a Thermoset", *Journal of Polymer Science: Part A: Polymer Chemistry*, 34, 249-260 (1996). --

Signed and Sealed this

First Day of February, 2005

JON W. DUDAS
*Director of the United States Patent and Trademark Office*